United States Patent [19]
Boyd et al.

[11] Patent Number: 5,404,016
[45] Date of Patent: Apr. 4, 1995

[54] DEWAR DETECTOR ASSEMBLY

[75] Inventors: Frank M. Boyd; David A. Hitzelberger; Wallace Y. Kunimoto, all of Santa Barbara; James A. Orr, Carpintera; Leonard E. Peck, Goleta, all of Calif.

[73] Assignee: Santa Barbara Research Center, Goleta, Calif.

[21] Appl. No.: 646,274

[22] Filed: Aug. 31, 1984

[51] Int. Cl.⁶ .............................................. G01J 5/04
[52] U.S. Cl. ........................... 250/352; 250/338.1; 250/339.02; 250/339.03
[58] Field of Search ............ 250/352, 338, 339, 338.1, 250/339.02, 339.03

[56] References Cited

U.S. PATENT DOCUMENTS

| | | | |
|---|---|---|---|
| 3,851,173 | 11/1974 | Taylor et al. | 250/352 |
| 4,451,735 | 5/1984 | Diedrich et al. | 250/352 |
| 4,528,449 | 7/1985 | Gordon | 250/352 |

*Primary Examiner*—Stephen C. Buczinski
*Attorney, Agent, or Firm*—W. C. Schubert; W. K. Denson-Low

[57] ABSTRACT

An infrared dewar-detector assembly for use as a common module which is interchangeable between various military infrared detection systems. The detector is cooled to cryogenic temperature for improved sensitivity. The dewar of the common module incorporates a metal coldfinger mounted on a base plate for attachment to an associated cryo-engine. The coldfinger supports the detector on a beryllium bridge platform. The configurations of both the platform mount and the base plate are selected to minimize the vibrations transmitted to the detector.

Signal paths from the detector include ribbon cables extending within the vacuum side of the dewar and having indium dot terminations making direct connections with a ceramic feedthrough header which, on the ambient pressure side of the unit, also includes indium pocket contacts for direct connection to the plug terminals of the unit.

44 Claims, 7 Drawing Sheets

DEWAR DETECTOR ASSEMBLY

BACKGROUND OF THE INVENTION

1. Field of the Invention

This invention relates to infrared detectors and, more particularly, to such a detector combined with a dewar in an assembly which is adapted as a common module for plug-to-plug compatibility with related common module elements making up a detection system.

2. Description of the Background Art

Dewar detector assemblies of the type to which the present invention is directed have been known for a number of years. Presently known designs center around modular metal and glass construction and include a vacuum-metallized glass dewar bore (commonly referred to as a coldfinger); a glass-to-metal sealed feedthrough assembly having radially directed leads; an indium sealed dewar window; a replaceable evacuation tube; and a getter system that can be reactivated.

The glass coldfinger may be considered the heart of an inner assembly. It is a cylindrical hollow glass member, closed at one end, which supports the infrared detector assembly and provides cooling and thermal isolation for the detector. The detector comprises an array of individual infrared detector elements. The optical input to the array is usually directed by one or more scanning mirrors.

A vacuum-metallized laser-delineated gold conductor pattern on the glass coldfinger carries signal and common leads from the detector array at the end or "platform" of the coldfinger. This gold conductor pattern extends across the end, then over the edge and down the exterior walls of the coldfinger. It will be appreciated that this is an extremely fragile element, very difficult and expensive to fabricate, particularly with the uniformity which is required for replaceable elements. Moreover, the structure of the feedthrough assembly and the arrangement for making connections to the gold conductor pattern on the outer wall of the coldfinger present substantial difficulties in making reliable connections. Circuit connections are provided via a pattern of 220 ribbon-type leads which are thermocompression-bond to the coldfinger conductors. Annular glass-epoxy feedthrough boards containing contact pins are individually soldered to each eyelet in the lead pattern. These in turn are individually soldered to four flexible flat ribbon cables which carry the signals to four quadrant sectors of the common module plug connector. Again, the connections between the ends of the ribbon cable conductors and the pins of the common module plug connector are individually soldered.

The considerable number of solder connections in the signal paths of the common module circuitry and the structural design of the coldfinger, in which the signal paths from the detector are formed of very fine gold lines extending along the circumferential surface of the cylindrical coldfinger, have resulted in certain problems with respect to production capability, fabrication cost, reliability and maintenance. Improvements in design and the use of other fabrication techniques could lead to solutions to certain of these problems.

For example, techniques are known for making electrical connections without the need for soldering. One such technique is disclosed in U.S. Pat. No. 4,125,310. That patent discloses the fabrication of printed circuit contact terminations having a plurality of copper buttons covered with a very thin layer of gold plating. A plurality of these contacts, mounted on a wafer in opposed juxtaposition to a corresponding pattern of adjacent circuit contacts, is brought together with the other circuit terminations and pressure is applied sufficient to force flow of the gold layer to develop a tight physical seal between the opposed surfaces which in turn, produces a reliable electrical connection. Such an arrangement lends itself to separation and resealing of the contact arrays, thereby being appropriate for use in the new common module of the present invention which is amenable to disassembly for repair and/or replacement of defective component parts.

Because of various problems as noted above with respect to cost, production capabilities, and maintenance, a new common module design is desired which would present substantial improvement over the aforementioned art and which would eliminate or minimize the problems which have been noted.

SUMMARY OF THE INVENTION

In brief, arrangements in accordance with the present invention comprise a dewar detector assembly incorporation (a metal dewar bore) for ruggedization and an electrical connector design which both reduces the number of circuit connections and eliminates all hand soldering. The design features of these arrangements of the invention are based on simplicity, durability, and overall producibility and result in a substantial improvement of the design. In particular, the common module of the present invention reduces the number of parts and production steps by about one-third, as contrasted with the prior art design, and unit cost in volume production is also significantly reduced.

In one particular arrangement in accordance with the invention, the dewar bore is (a three-piece metal coldfinger) consisting of a platform, cylinder and adaptor all brazed together to form a coldfinger subassembly. The coldfinger seats into a bulkhead and is laser welded thereto. By utilizing metal construction for the dewar bore, a number of benefits accure. Glass coldfingers are extremely fragile and can be damaged at an advanced stage of assembly, while metal coldfingers are virtually indestructible in normal handling. A further feature is the elimination of the problematical glass-to-metal seal; a laser weld insures vacuum integrity. In addition, the detector array of this common module has a higher cooling capacity than the prior art unit. This is realized by the use of two different metal alloys, the platform metal being selected for high thermal conductivity to allow high heat transfer to the detector while a low thermal conductivity alloy is used for the cylinder walls to impede exterior heat transfer.

A further feature of the present invention is the use of four flexible etched cables within the dewar vacuum region to replace the deposited metallized conductor pattern on the previous glass dewar bore, thus eliminating numerous problems and disadvantages resulting from the previous design while improving the operational capability of the common module.

Another feature of the present invention involves the use of a ceramic header assembly mounting the individual feedthrough circuit paths from the high vacuum space within the dewar to the ambient pressure side where the circuit connections are continued to the pins of the modular plug connector. This ceramic header comprises a number of layers formed as a sandwich between the contact pins and the flexible cables from the detector array. The individual contact connections at the opposite surfaces of the ceramic header assembly incorporate gold or indium dot elements, similar to the contact structure of the above-mentioned U.S. Pat. No. 4,125,310, and the contact integrity is established by forcing the contact elements together under pressure.

Other design improvements incorporated in the preferred embodiment will be described hereinafter.

BRIEF DESCRIPTION OF THE DRAWING

A better understanding of the present invention may be had from a consideration of the following detailed description, taken in conjunction with the accompanying drawing in which.

Figure 1:
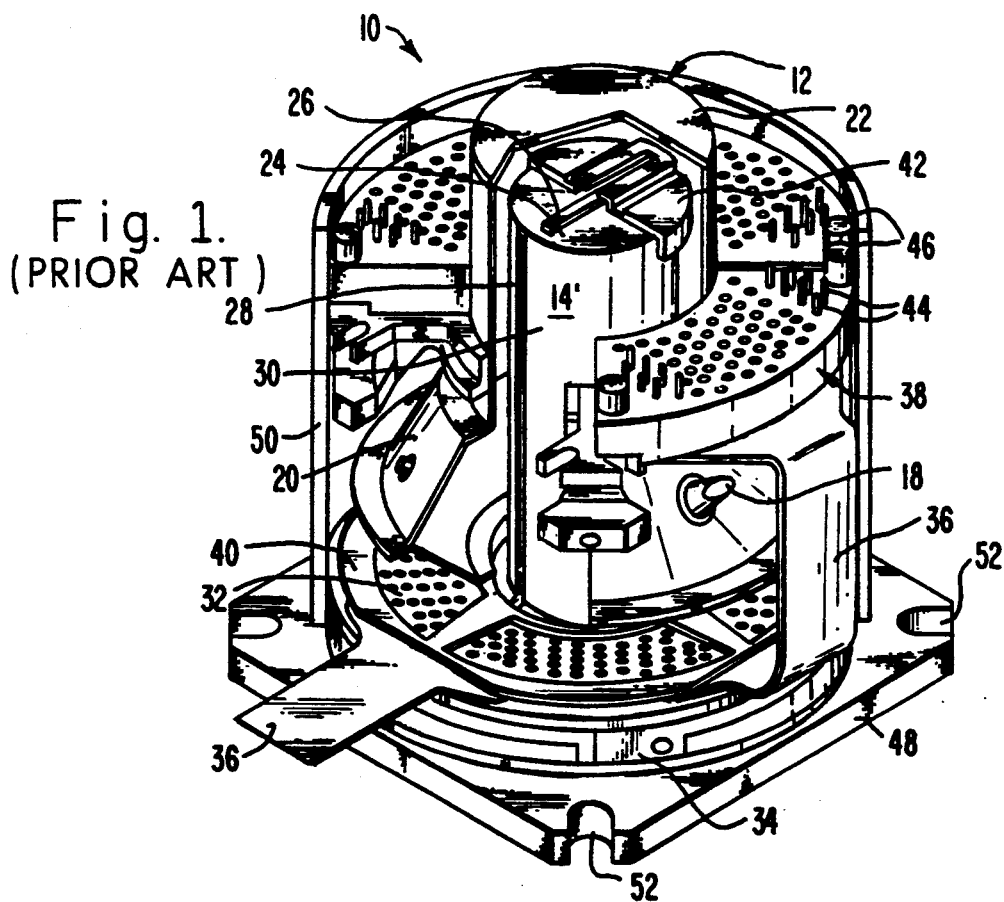
FIG. 1 is a sectional view of a dewar detector assembly of the prior art.

DESCRIPTION OF THE PRIOR ART DEVICE (FIG. 1) depicts a prior art common module 10 as comprising a dewar 12 having a coldfinger 14 mounted within an outer shell 16. During the final stages of fabrication, the space between the coldfinger 14 and the shell 16 is evacuated via a tube 18 which is then pinched off, and one or more getters, such as 20, are fired to complete the evacuation process. The shell 16, of a nickel-iron alloy, is closed at the top by a window 22 which is transparent to infrared radiation and is soldered with an indium preform to the shell 16. The window 22 is of germanium and is bandpass anti-reflection coated for maximum transmission in the 7.5 to 12.0 $\mu$m spectral region.

The coldfinger 14 is fabricated as a hollow glass cylinder, closed at the upper end to provide a platform 24 for the infrared detector 26. The coldfinger 14 is coated with a layer of some 220 leads, of which three leads 28 are shown, which are connected to respective elements of the detector 26 and extend across the end, over the edge, and down the exterior cylindrical surface 30 of the coldfinger 14.

A feedthrough assembly (not shown) is formed as a 0.002-inch thick gold-plated nickel-iron alloy pattern that is fused in glass between two nickel-iron alloy flanges. It slides down over the coldfinger 14 and seats on a flange at the base thereof, where 220 ribbon-type leads are thermocompression-bonded to the coldfinger conductors 28. To support the fragile outer feedthrough pattern, annular glass-epoxy feedthrough boards 32 containing a plurality of contact pins are individually soldered to each eyelet in the pattern. The feedthrough boards are in turn supported by a metal bracket 34.

Four flexible flat conductor cables 36, again soldered individually to the feedthrough board pins, carry the signals to four electrical connectors 38 which together make up the module plug connector encircling the dewar 12. Plastic shims 40 are bonded on top of the cables 36 at the feedthrough boards 32 to provide strain relief to the soldered connections.

The detector assembly 26, comprising the detector array, its substrate and proximal silicon coldshield, is adhesive-bonded to the coldfinger platform 24. A metal slot shield 42, equivalent to f/0.9, is adhesive-bonded to the coldfinger platform 24 to provide improved detector performance. The dewar also incorporates a pair of silicon temperature-sensitive diodes (not shown) which are bonded to the coldfinger platform 24 with a conductive epoxy.

Each plug connector quadrant segment 38 contains a plurality of terminal connector pins 44 to which the conductors of the ribbon cables 36 are soldered on the underside. Each segment 38 is mounted to a frame by screws 46. The entire assembly is mounted on a base plate 48 with an enclosing housing 50. The common module 10 may then be secured in place on a associated cryo-engine by bolts extending through corner slots 52 in the base plate 48.

DESCRIPTION OF THE PREFERRED EMBODIMENT

Figure 2:
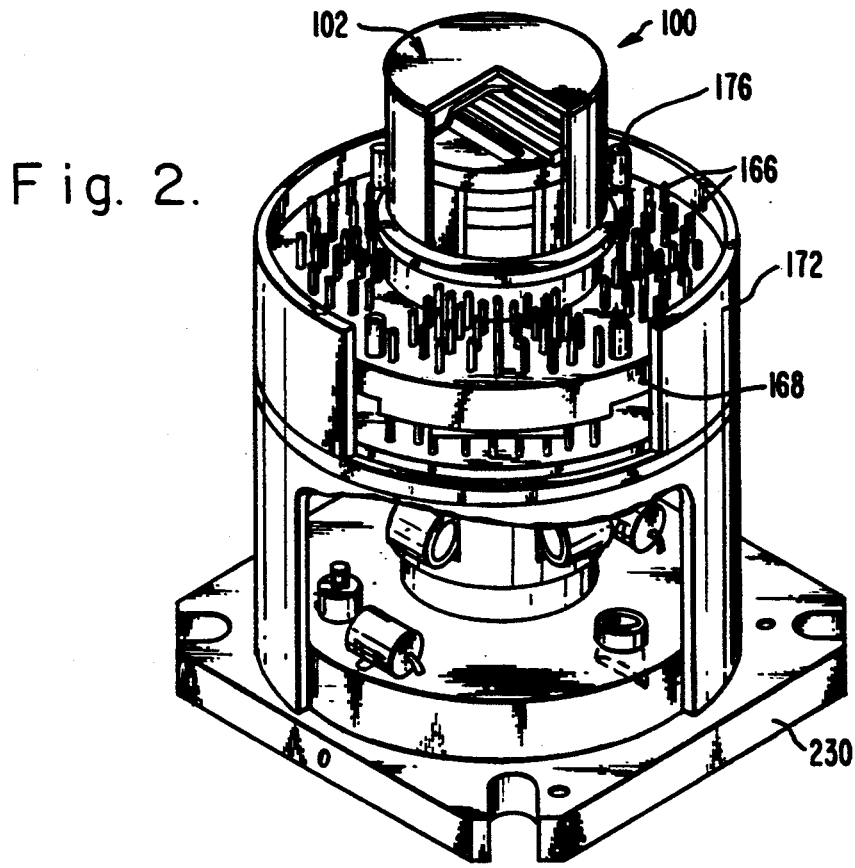
FIG. 2 is a sectional view of a dewar detector assembly in accordance with the present invention.
Figure 3:
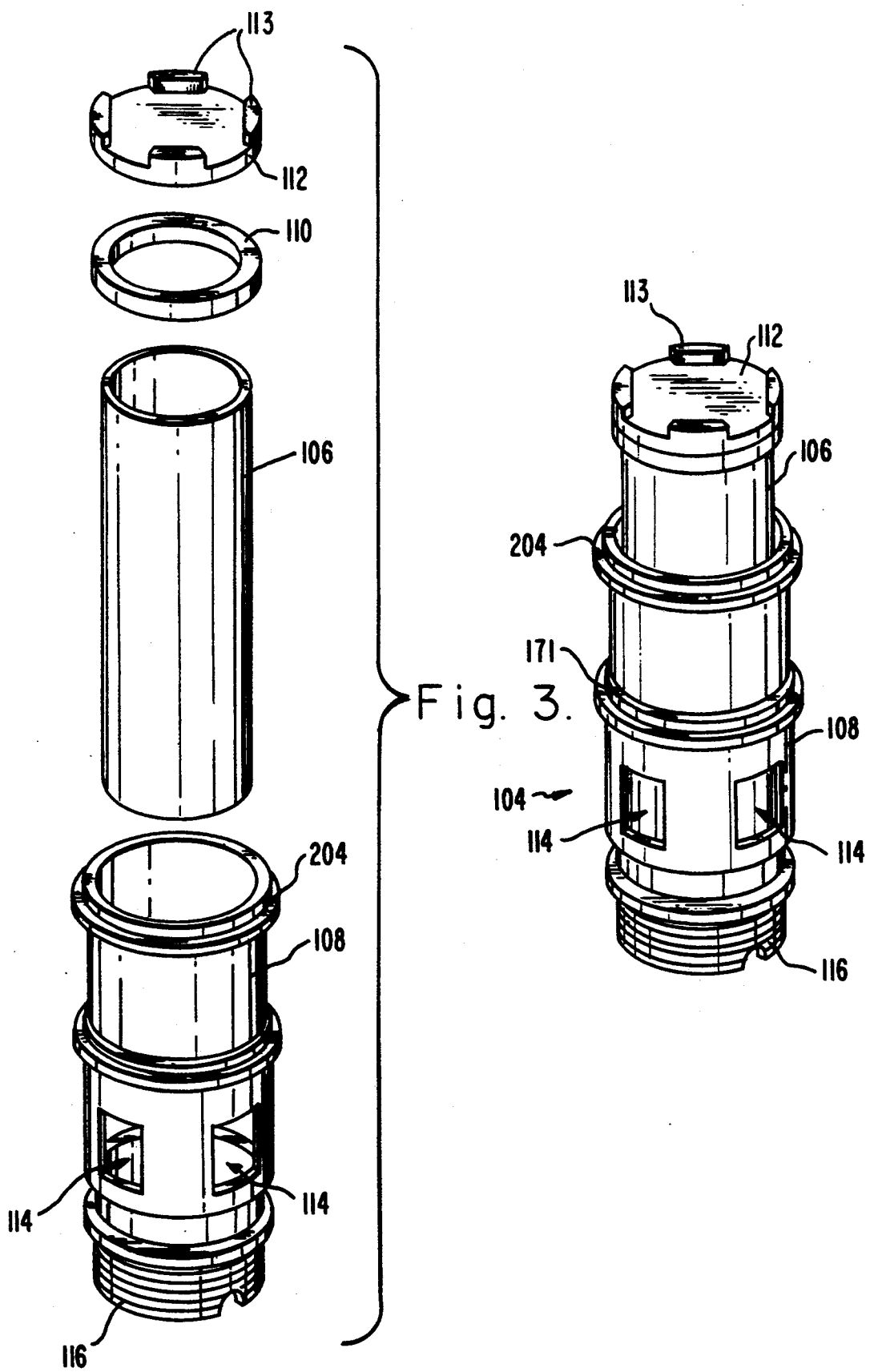
FIG. 3 is an exploded view of the coldfinger assembly incorporated in the module of FIG. 2.

FIG. 2 a sectional and partially cutaway drawing similar in form to FIG. 1, shows a dewar detector unit 100 as a preferred embodiment of the present invention. FIGS. 3-12 show various components and subassemblies making up the unit 100. The dewar 102 of the module 100 principally comprises a coldfinger assembly 104, shown in FIG. 3 as including a tube 106 mounted within a housing 108. The tube 106 is constructed of titanium and, because of its extended thin-wall construction, provides improved thermal isolation for the associated detector array as well as being much more durable than the glass coldfinger of the prior art unit. A ring 110 and cap 112 are mounted on the end of the tube 106. The housing 108 is provided with four windows 114, equally spaced about its circumference, and is threaded at its bottom end 116. The windows 114 permit connector cables from the detector array at the end of the coldfinger to pass through the housing 108.

Figure 4:
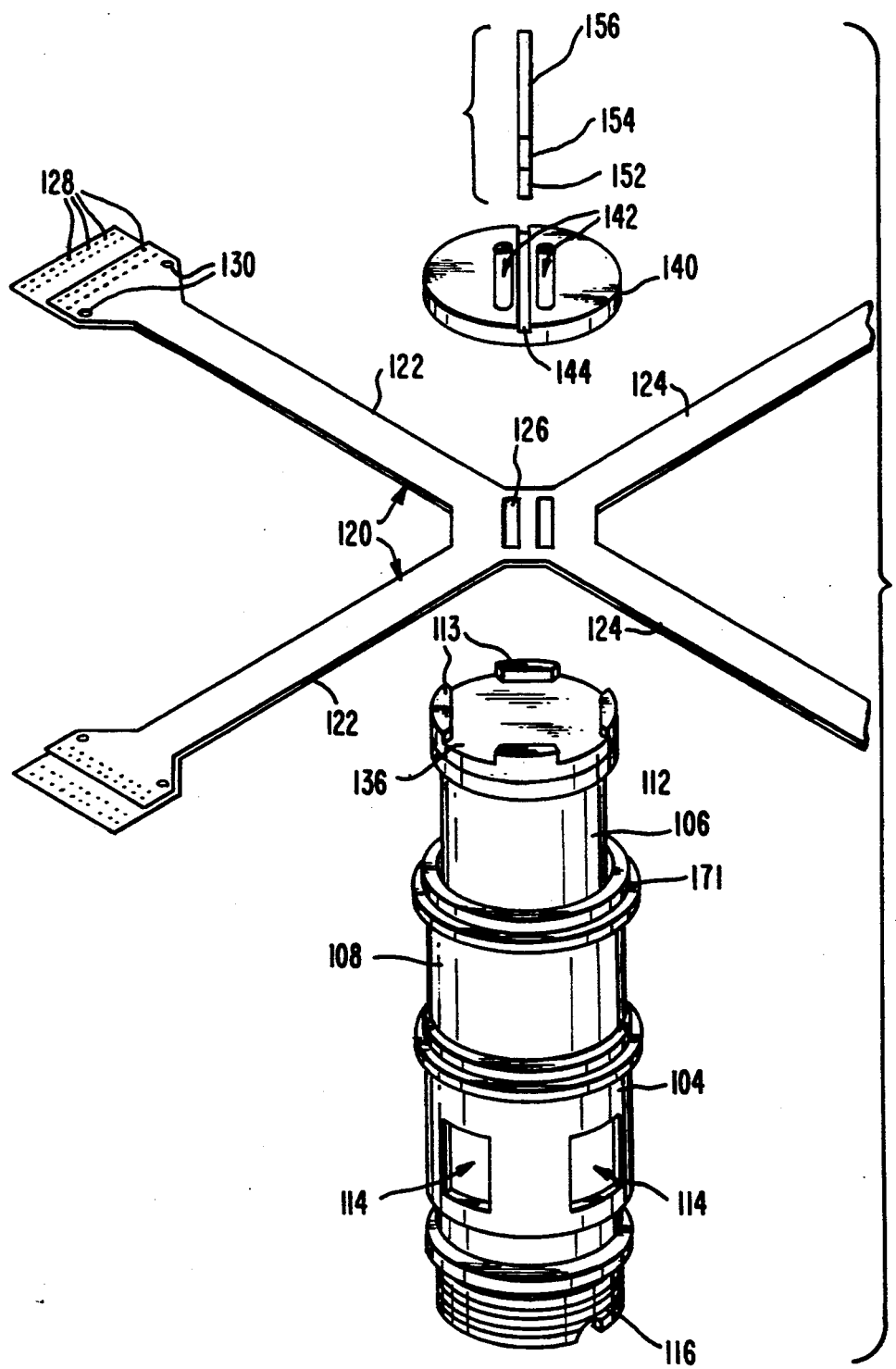
FIG. 4 is an exploded view showing the manner in which the detector array and the ribbon conductor cables are mounted on the coldfinger assembly.
Figure 7:
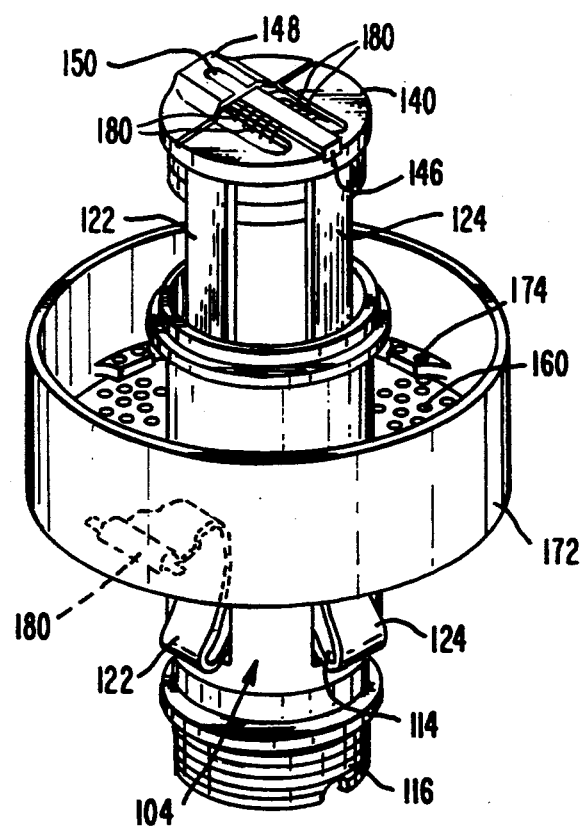
FIG. 7 is a perspective view, partially in phantom, of a subassembly incorporating the detector array, coldfinger, header assembly and interconnecting circuit conductors.

The manner in which the detector and the ribbon cables are mounted is best illustrated in FIGS. 4 and 7. The cables 120 are shaped in the manner shown in FIG. 4. Each cable 120 is actually a pair of cables 122, 124 each carrying 55 individual conductors. These cables 122, 124 are etched thin, film, made from pre-rolled foil which is stronger and more reliable than evaporated or plated-up leads. These cables take the place of the vacuum-metallized, laser-delineated pattern of conductors 28 on the glass coldfinger of the prior art unit shown in FIG. 1. The cables 122,124 are joined together for structural stability to form a single cable pair 120. Each individual cable such as 122 terminates at the inner end in a window 126 where the insulation is removed to provide access to the individual conductors of the cable. Each cable such as 122 comprises a double layer of insulated conductors and terminates at its outer end in a plurality of exposes contacts 128. The outer end of the cable is stepped to permit access to all of the terminal contacts 128 in both layers of the cable and is also provided with a pair of alignment holes 130.

Figure 5:
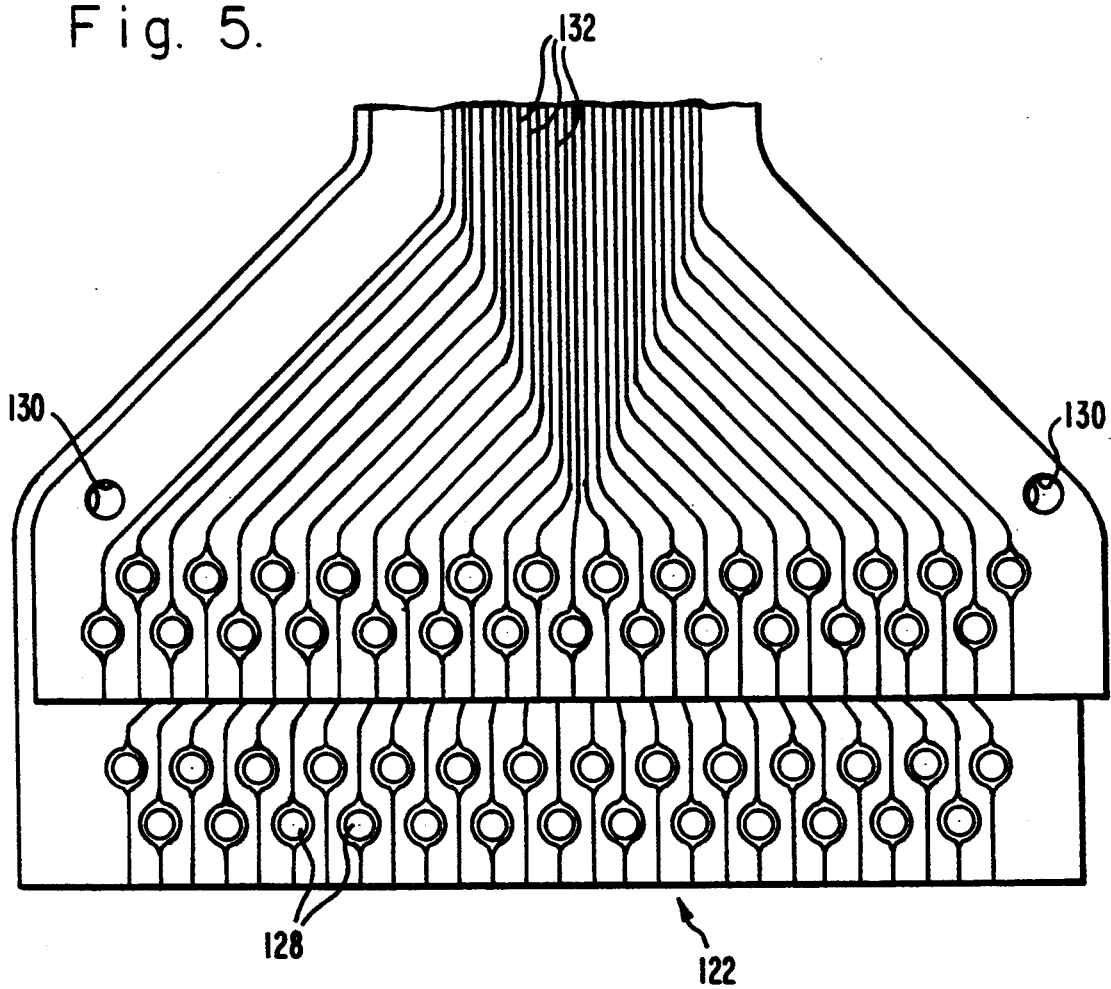
FIG. 5 is a plan view of the header end termination of a ribbon conductor cable providing connections to the detector.

Details of the outer end termination of a cable such as 122 are shown in FIG. 5. Each individual conductor 132 of a cable such as 122 is provided with a contact 128 comprising an indium dot which makes contact in the manner to be described hereinafter with mating contact elements in a feedthrough header. Contacts 128 may also comprise gold dot utilized in the same manner as the indium dot.

Referring again to FIG. 4, the cables 120 extend from a position on top of the cap 112 through individual slots 136 between raised pillar segments 113, downward along the coldfinger tube 106 within the housing 108 and out through corresponding windows 114 in the manner shown in FIG. 7. A detector platform 140, having opening 142 aligned with the windows 126 of the cables 120, is mounted on the raised pillars 113 of end cap 112, bridging the central portions of the cables 120. The platform 140 is provided with an elongated central recess 144 in which the detector chip assembly 146 is mounted by adhesive bonding. As shown in FIG. 7, a cold shield 148 having an elongated opening 150 aligned with the detector assembly 146 is mounted as an end cap over the detector assembly and bonded to the platform 140. The detector assembly 146 comprises a detector array 152, a silicon cold shield 154 and a silicon baffle 156, the cold shield and baffle being transparent to infrared radiation in the range to which the detector array 152 is responsive.

Figure 6:
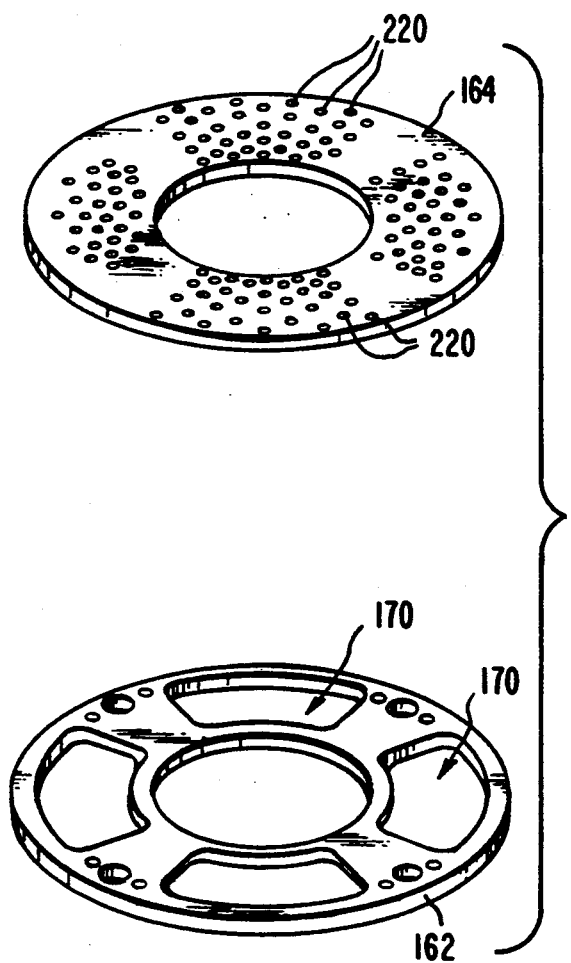
FIG. 6 is an exploded view of the header assembly incorporated in the arrangement of FIG. 2.
Figure 6:
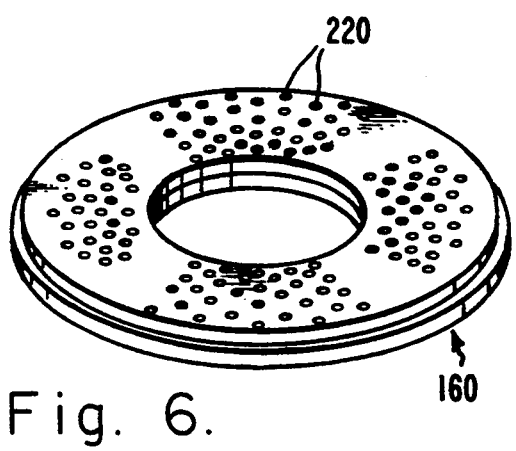

FIG. 6 shows a feedthrough header assembly 160 comprising an apertured frame 162 and a ceramic distribution board 164. The distribution board 164 is of sandwich construction, being made up of four layers of ceramic and four layers of tungsten metallization. The board 164 serves as a vacuum feedthrough and also, by virtue of circuit paths on the individual layers, provides for transmission of the signals on the cables 120 to terminal pins 166 in a plug connector ring 168 of the module 100 (see FIG. 2). The distribution board 164 is provided on its underside with groups of flat contact elements which are accessible through the windows 170 of the frame 162, together with pairs of alignment pins near the edges of each of the windows 170. These flat contact elements mate with the indium dots of the individual contacts 128 of the flex cables 122 and provide secure, reliable contact paths when the terminal ends of the cables 120 are pressed against them.

The header assembly 160 is mounted on a ring 171 (FIG. 3) of the coldfinger assembly 104 in the manner shown in FIG. 7. A connector shroud 172 is installed above the header assembly 160, having ledges 174 with threaded holes for receiving mounting screws 176 (FIG. 2) for retaining the plug connector ring 168. As shown in FIG. 7, the cables 122 pass through the windows 114 and then extend upwardly along the outside of the coldfinger housing 108 to connect with contact elements on the underside of the ceramic distribution board 164 through the windows 170 (see FIG. 6). They are held in position against the contact elements on the underside of the distribution board 164 by clamps 180. The clamps 180, one for each cable, attach to the underside of the frame 162 and provide the necessary pressure on the indium dots of the cable contacts 128 to develop the cold flow of the indium in the manner of the technique described in the above-referenced U.S. Pat. No. 4,125,310, the disclosure of which is incorporated herein by reference. For the purposes of the present invention, indium dots are preferable to gold dots for the contact members because they require about one-fourth of the force to achieve the desired cold flow of the contact surface material.

Referring again to FIG. 7, the connections to the detector assembly 146 are made by wire bonding the terminals 181 of the detector array directly to the exposed conductors of cables 120 in the windows 126 (see FIG. 4) through the elongated openings 142 of the detector platform 140.

Figure 8:
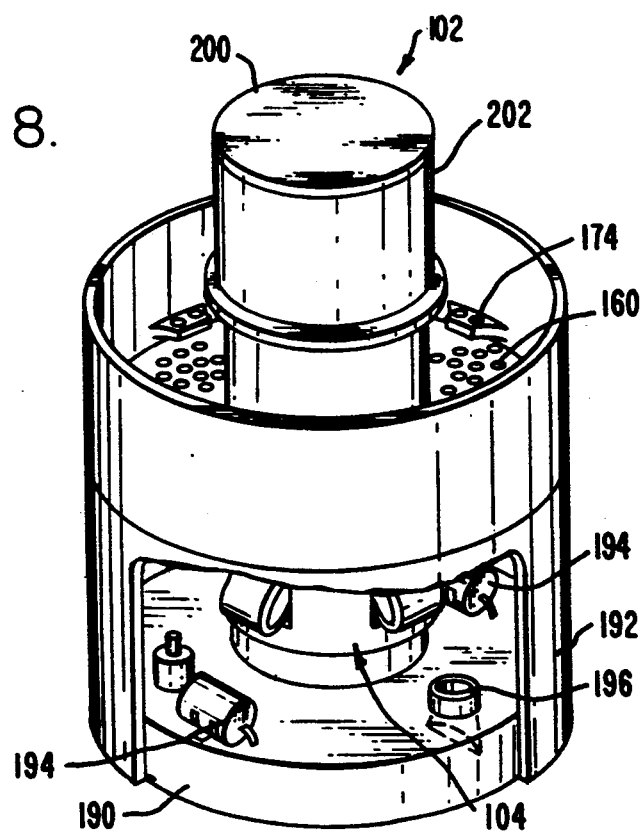
FIG. 8 is a perspective view, partially broken away, of a more complete subassembly of the unit of FIG. 2, showing the subassembly of FIG. 7 mounted on a lower bulkhead and with a window enclosure over the detector array.

FIG. 8 shows the subassembly of FIG. 7 mounted on a bulkhead 190 with a metal shield 192, shown partially broken away, in place. Getter assemblies 194 and an evacuation tube 196 are shown mounted on the bulkhead 190. The space between the bulkhead 190 and the ceramic header assembly 160, surrounded by the shield 192, is evacuated and maintained at the high vacuum of the dewar 102. The shield 192 is effective both as a vacuum wall and to provide electromagnetic interference shielding for the signal conductors. A window 200, like that of the prior art unit of FIG. 1, is shown in FIG. 8 as being mounted on a window cup 202. The cup 202 is a cylindrical ring which seats on an upper shoulder 204 of the coldfinger assembly 104 (best shown in FIG. 3).

Figure 9:
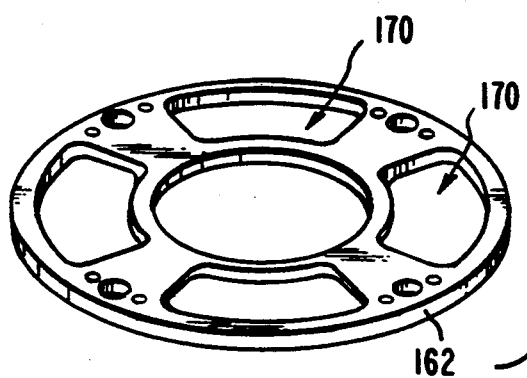
FIG. 9 is a perspective view showing the terminal connector assembly with circuit components attached for insertion at the top of the subassembly of FIG. 8.
Figure 9:
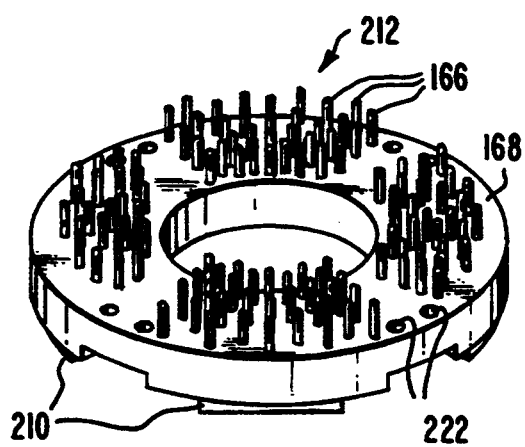

FIG. 9 shows certain details of the ring plug connector 168 which is assembled with resistor boards 210 on the underside thereof, making up a bias pack assembly 212. The terminal pins 166 of the connector 168 extend completely through the ring or base member and the resistor boards 210 are installed on the pins extending from the underside. As shown in FIG. 2, these pins 166 extending from the underside of the ring 168 make contact with indium dots 220 installed in pockets in the conductor terminations in the upper surface of the distribution board 164 of the header assembly 160 (see FIG. 6). As an alternative, conductive rubber pads may be used in place of the indium dots 220. The ring connector 168 is mounted in position on the ledges 174 of the connector shroud 172 and is held in position by means of the screws 176 extending through holes 222, thereby maintaining the downward pressure on the connector ring assembly to develop the integrity of the contacts at the indium dots 220.

The common module 100 includes base plate 230 (FIG. 10) which is held in place by a spanner nut 232 (FIG. 12) which extends through the opening 234 of the base plate 230 and threads onto the bottom portion 116 of the coldfinger assembly 104. The common module 100 is mounted to an associated cryo-engine by bolts through corner slots 236 of the base plate 230.

Figure 10:
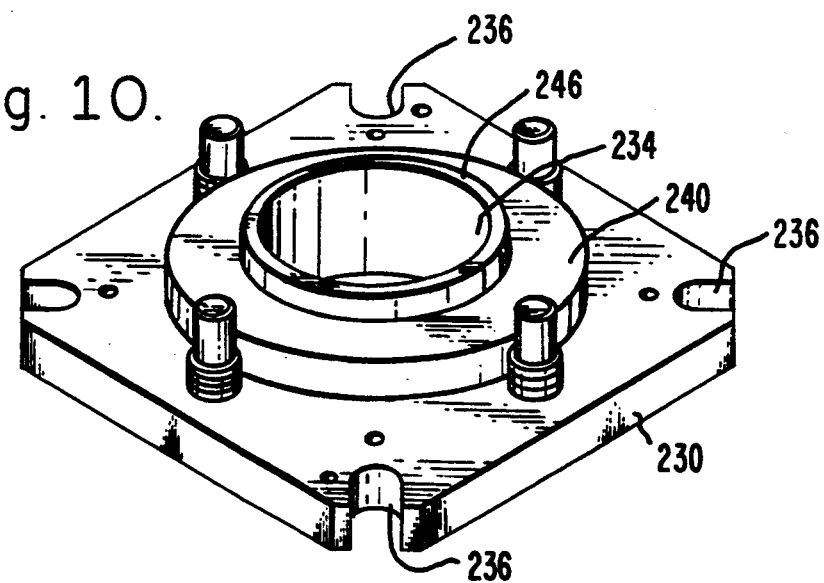
FIG. 10 is a perspective view of a common module base plate on which the assembly of FIG. 8 is mounted.
Figure 11:
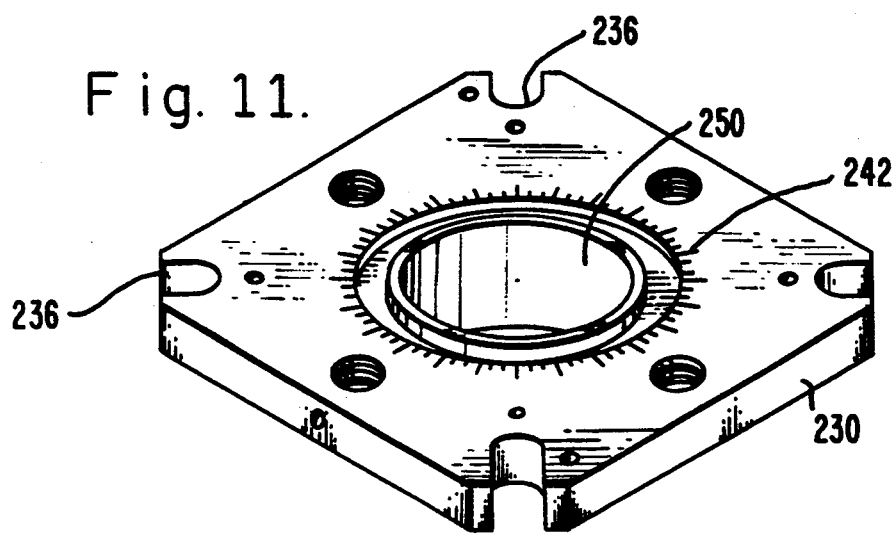
FIG. 11 is a view from the underside of the base plate of FIG. 10.
Figure 12:
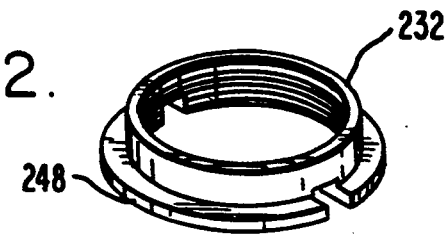
FIG. 12 shows a spanner nut which is attached to the base of the coldfinger to hold the various elements of the common module together.

The base plate 230 is provided with a special construction to reduce the shock and vibration which may be transmitted to the coldfinger and detector of the common module from the cryo-engine. This is shown in the view of FIGS. 10 and 11, respectively the upper and lower sides of the base plate 230, as an annular offset hub 240 extending upwardly from the plane of the base plate 230. On the underside, this is shown as an annular recess 242. The coldfinger assembly rests on an annular mount 246 extending upwardly from the annular offset 240, retained in position by the annular rim 248 of the spanner nut 232 (FIG. 12) bearing against an annular shoulder 250 within the opening 234. This configuration of the mounting plate in the form of an elastic annular diaphragm and the manner in which the coldfinger assembly is affixed thereto provides a substantial degree of isolation for the structure so that the vibrations from the associated cryo-engine which are transmitted to the coldfinger assembly are substantially reduced. The annular offset portion or hub 240 provides a degree of resilience and acts as a very stiff spring. The vibration from the cryo-engine extends over a fairly broad frequency spectrum. The configuration of the offset hub 240 and the manner of mounting the coldfinger thereon serve to isolate the coldfinger from substantially all vibration above approximately 500 hertz, thus rendering the coldfinger and the detector array essentially immune to the cryo-engine vibration.

The overall design of the common module of this invention includes a number of structural features which result in a unit that constitutes a substantial improvement over the dewar detector unit of the prior art. These features not only serve to relax the requirements imposed on the manufacturing steps for producing the various components making up the unit—in particular, the need to resort to the difficult process required to produce the fineline conductors on the glass coldfinger of the prior art unit is eliminated—but the structure of the invention embodiment results in a reduction of vibration and other microphonic interference at the detector, a reduction in the heat load imposed on the refrigerator, and an improvement in unit performance and reliability.

A significant improvement in the effectiveness of the detector array derives from the novel manner of mounting the array at the end of the coldfinger. The platform 140 which is interposed between the detector and the end cap of the coldfinger provides for improved cooling of the detector array while at the same time, in cooperation with the vibration isolation mount at the base of the common module unit, substantially reduces the microphonic noise generated by the detector. The platform 40 on which the detector is mounted is formed of beryllium and its extended area of contact with the upraised planar surfaces at the end of the coldfinger (see FIG. 4) provides the improved thermal conductivity for heat generated at the detector array when the detector is biased for operation. This provides better thermal conductivity than the previous glass coldfinger, glass being a poor conductor of heat, and results in a significant reduction in the operating temperature of the detector thereby increasing its sensitivity.

Furthermore, the platform 140 may be considered a bridge structure, being supported on the planar surfaces of the four pillars 113 at the end of the coldfinger, and serves to further isolate the detector array from vibrations reaching the coldfinger by virtue of this bridge configuration. Since the bridge platform 140 is supported away from the planar portion of the end cap 112, the detector is isolated from the "drum head" effect of vibration at the center of the end cap. It is extremely important from the standpoint of signal-to-noise ratio to isolate the detector array from all vibrations within the frequency range of interest to the fullest extent possible.

The detector array is not only an optical transducer, but it is piezoresistive as well. Any bending of the detector element, as from vibration, produces a corresponding change in signal output, just as though there were a change in the incident radiation. The beryllium material of the platform bridge 140 has a modulus of elasticity which is about six times that of glass; therefore the beryllium bridge supports the detector array much more rigidly than was possible with the glass coldfinger of the prior art. In addition the vibrations transmitted to the coldfinger from the associated cry-engine are materially reduced by virtue of the mounting configuration of the base plate as described hereinabove. The signal-to-noise ratio for the detector array in the dewar detector of the present invention is materially improved by virtue of the vibration isolation mounting arrangements employed in this common module.

The combination of the fine line ribbon cables, the ceramic feedthrough header and the indium dot contacts also serves to provide substantially improved operation of the detector, as well as improved reliability and ease of production and maintenance. The individual conductors in the cable provide good electrical conduction but poor thermal conduction, thereby improving the thermal isolation of the detector and reduciang the heat load on the associated cryo-engine. The present signal path connection arrangement reduces the number of individual connections by more than 50% as contrasted with the prior art detector. Circuit reliability is improved, not only by virtue of the reduction in the number of individual connections, but also as a result of the indium dot contact arrangement. Furthermore, ease of production and repair in making and unmaking the contacts, when necessary for maintenance, is facilitated because the contacts at the ceramic feedthrough member are made simply by pressing the indium dots against the opposing contact surfaces and the contacts can be opened by merely disassembling the opposed elements. This arrangements advantageously permits ready replacement of the detector array, merely by disassembling the unit, removing the platform, detector and attached ribbon cables, and installing a new detector subassembly with suitable modification of the bias resistors 210 if required.

Although there has been described above one specific arrangement of a dewar detector assembly in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A dewar detector unit for use in infrared imaging equipment comprising:

a metal coldfinger assembly including an inner wall tube having an end cap affixed to one end and an outer housing having a base portion joined to the tube at the end opposite said end cap, the housing extending coaxially along a substantial portion of the length of the tube and being spaced radially therefrom;

a platform mounted on and spaced from said end cap;

a detector array mounted on said platform in a position to receive incident radiation and develop electrical signals corresponding thereto, said platform being spaced from said end cap a distance sufficient to reduce the impact of vibration from said end cap on said detector array;

an annular header mounted in sealing relationship to said housing between a high vacuum region and an ambient pressure region of the unit, the header having a plurality of feedthrough circuit paths extending between respective contact elements of a first plurality on one side of the header and contact elements of a second plurality on the other side of the header;

wall means connected to the header and defining therewith a vacuum chamber surrounding the base of the coldfinger assembly;

an annular connector ring having a plurality of terminal pins in the ambient pressure region of said detector mounted thereon for providing external electrical connections to the internal circuitry of the unit; and a plurality of electrical conductors formed in ribbon cables extending between circuit leads of the detector array and the contact elements on the vacuum side of the header.

2. The unit of claim 1 further including housing closure means comprising a window mounted transversely to the axis of the coldfinger assembly, adjacent to but spaced from the detector array, the window being capable of transmitting said incident radiation to the detector array.

3. The unit of claim 2 wherein the closure means further includes a generally cylindrical window cup mounted as an extension of the outer housing and supporting the window in position thereon.

4. The unit of claim 1 wherein the inner tube of the coldfinger assembly is formed as a thin-walled cylinder comprising titanium for supporting the end cap, the platform and the detector array in thermal isolation with respect to heat which is present at the base of the coldfinger assembly.

5. The unit of claim 1 wherein the end cap is formed with a plurality of pillars adjacent the periphery of the end cap for supporting the platform in a position displaced from the cental region of the end cap.

6. The unit of claim 5 wherein the pillars terminate in planar surfaces which are generally coplanar with each other, and the surface of the platform facing the end cap is configured to meet with said coplanar surfaces.

7. The unit of claim 6 wherein the pillars are spaced from each other to define individual slots between adjacent pairs of pillars, and wherein the ribbon cables extend across the end cap in the space between the platform and the end cap, through said slots and along the coldfinger assembly in the space between the inner tube and the outer housing.

8. The unit of claim 7 wherein the outer housing defines a plurality of windows, one for each ribbon cable, in communication with said vacuum chamber.

9. The unit of claim 8 wherein each ribbon cable is fed through a corresponding window in the outer housing of the coldfinger assembly for connection with corresponding contact element on the vacuum side of the header.

10. The unit of claim 9 wherein the ribbon cables are provided with windows providing access to the conductors thereof in the region extending across the end cap, and wherein the outer terminating ends of the cables are provided with a plurality of indium dots, one for each signal conductor in the cable, arranged in a generally planar array for making contact with the contact elements on the vacuum side of the header.

11. The unit of claim 10 further including clamping means for clamping the termination portions of the ribbon cables to the header with sufficient force to establish gas-tight sealing contacts between the indium dots and the adjacent contact elements of the header.

12. The unit of claim 11 wherein the gas-tight sealing contacts are releasable upon the removal of the clamping means.

13. The unit of claim 1 wherein the contact elements on the ambient side of the header comprise resilient conductive elements for establishing releasable connections with the terminal pins of the annular connector ring.

14. The unit of claim 13 wherein the terminal pins of the connector ring extend through said from one side to the other, and further including means for affixing the connector ring in position with the inner ends of the terminal pins bearing against the resilient conductive elements.

15. The unit of claim 14 wherein the last-mentioned means comprise a plurality of mounting screws threadably coupled to the header to direct the connector ring toward the header.

16. The unit of claim 13 wherein the resilient conductive elements individual conducting rubber pads.

17. The unit of claim 13 wherein the resilient contact elements comprise individual indium deposits within pockets formed in the header and connected to individual feedthrough circuit paths.

18. The unit of claim 1 wherein the header comprises a plurality of individual ceramic layers forming a ceramic distribution board, each layer having a conductor pattern formed thereon for establishing predetermined feedthrough circuit paths between contact elements on opposite sides of the header.

19. The unit of claim 18 wherein the header further includes a metal frame for mounting the ceramic distribution board, the metal frame having a plurality of windows for registration with the terminal ends of the ribbon cables, and means for securing the clamps means.

20. The unit of claim 10 wherein the platform defines a pair of elongated windows in registration with the windows in the ribbon cables, and further includes an elongated recessed slot aligned between said platform windows for mounting the detector array therein.

21. The unit of claim 20 further including a plurality of individual conductors wire bonded to the conductors of the cables at the windows thereof, said individual conductors extending through the windows of the platform for contacting individual pixel elements of the detector array.

22. The unit of claim 1 further including detector biasing means mounted on the terminals of the annular connector ring.

23. The unit of claim 1 wherein the wall means comprise an annular bulkhead member mounted to the base of the coldfinger assembly and extending generally orthogonally therefrom and a cylindrical shield surrounding the vacuum chamber and extending between the header and the bulkhead member.

24. The unit of claim 23 wherein the cylindrical shield is formed of metal to provide both vacuum wall support and electromagnetic shielding.

25. The unit of claim 1 further including a base plate for mounting the coldfinger assembly thereon, and a spanner nut bearing against the base plate on the side remote from the coldfinger assembly, said spanner nut threadably engaging the base portion of the coldfinger assembly.

26. The unit of claim 25 wherein the base plate includes an elastic annular diaphragm for isolating the coldfinger assembly from vibrations generated by an associated cryo-engine.

27. The unit of claim 26 wherein the elastic annular diaphragm is formed by an annular hub which is offset from the plane of the base plate in the direction of the coldfinger tube, the side of the base plate remote from the coldfinger tube having an annular recess generally in registration with the annular hub to from the elastic annular diaphragm.

28. The unit of claim 1 further including a generally cylindrical connector shroud mounted to the header on the ambient side thereof, the shroud including a plurality of interior ledges providing threaded mounting means for securing the connector ring in position with the terminal pins thereof bearing against adjacent contact elements of the header.

29. A metal coldfinger assembly for supporting a platform bearing a detector array adjacent an outer end thereof, the assembly comprising:
an inner thin-walled cylindrical tube;
an outer housing joined to the tube adjacent one end thereof, the housing surrounding the tube along the length thereof and being spaced from the tube;
an end cap mounted across the end of the tube remote from the base portion, the end cap being formed with a plurality of pillars adjacent the peripheral edge of the end cap, the pillars having flat terminating surfaces generally coplanar with each other for supporting the detector platform in spaced displacement from the central portion of the end cap and defining peripheral slots for ribbon conductor cables to be connected to the detector array; and
a threaded portion at the base of the outer housing for releasably mounting the assembly.

30. The unit of claim 29 wherein the outer housing defines a plurality of windows for permitting the ribbon cables to pass through after traversing the space between the inner tube and the outer housing from the slots in the end cap.

31. The assembly of claim 30 further including a peripheral shoulder extending radially outward from the outer housing for mounting an annular header thereon in sealing relationship.

32. The assembly of claim 30 further including a circumferential mounting ring about the end of the outer housing remote from the base portion for supporting a cover member including an optically transparent window for closing off the end of the outer housing.

33. The assembly of claim 32 further including a base plate for attaching the coldfinger assembly to a cryo-engine, the base plate including means for isolating the coldfinger assembly from vibrations developed by the cryo-engine.

34. The assembly of claim 33 wherein the vibration isolating means comprises an annular hub portion for mounting the coldfinger assembly, the annular hub portion being offset from the plane of the base plate to define an elastic annular diaphragm.

35. A ceramic header assembly for use in feeding signals between the vacuum side and the ambient pressure side of a dewar detector unit, the header assembly comprising:
a generally annular frame having a plurality of windows extending through the frame for providing access to associated circuit conductor cables on the vacuum side of the header; and
a ceramic distribution board mounted on the frame and comprising a sandwich configuration of individual ceramic layers, each having a selected arrangement of signal paths thereon communicating with corresponding signal paths of an adjacent layer;
the signal paths at the surface adjacent the ambient pressure side terminating in pockets containing indium inserts for developing electrical continuity with pin terminals which may pressed against the indium inserts, the signal paths on the vacuum side of the header terminating in generally planar contact elements for establishing electrical continuity with indium dots mounted on individual conductors of the ribbon cables accessing said planar surfaces through the windows of the frame.

36. The header assembly of claim 35 further including means defining a central circular opening for engaging a mating surface on a coldfinger assembly to be mounted to the header assembly within said opening.

37. The header assembly of claim 36 further including means defining a peripheral ring portion of the header assembly for sealing attachment to wall means defining a vacuum chamber on the vacuum side of the header assembly.

38. A coldfinger assembly including an inner tube having an end cad across one end of said tube; a platform mounted on and spaced from said end cap; and a detector array mounted on said platform in a position to receive incident radiation and develop electrical signals corresponding thereto, said platform being spaced from said end cap a distance sufficient to reduce the impact of vibration from said end cap on said detector array.

39. The coldfinger assembly of claim 38 further comprising means for attaching said coldfinger assembly to cryo-engine means, said attaching means including means for reducing the impact of vibrations developed by said cryo-engine on said coldfinger assembly.

40. The coldfinger assembly of claim 38 further comprising means for attaching said assembly to a device that produces vibrations, said attaching means including means for reducing the impact of vibrations developed by said device on said coldfinger assembly.

41. An assembly for use in feeding signals between the vacuum side and the ambient pressure side of a dewar detector unit, said assembly comprising:
frame means including means for providing access to associated circuit conductor cables on the vacuum side of said assembly; and
means mounted on said frame means for providing a predetermined, selected arrangement of signal paths from the vacuum side to the ambient pressure side of said dewar detector unit, the signal paths on the vacuum side of said assembly terminating in contact elements adapted to be engaged through means producing pressure without soldering substantially simultaneous electrical connections in said predetermined selected arrangement to a plurality of individual metallic dots mounted on individual conductors of said cables.

42. The assembly of claim 41 wherein the signal paths on the ambient pressure side of said unit include metal inserts for developing electrical contact, without soldering, indirectly with said contact elements by other means exerting pressure on said metal inserts.

43. The assembly of claim 42 wherein said means mounted on said frame means comprises a ceramic distribution board comprising a sandwich configuration of individual ceramic layers.

44. The assembly of claim 43 wherein said cables are fine line ribbon cables.

* * * * *